(12) United States Patent
Park et al.

(10) Patent No.: US 7,495,390 B2
(45) Date of Patent: Feb. 24, 2009

(54) ELECTRO-LUMINESCENCE DEVICE WITH IMPROVED THERMAL CONDUCTIVITY

(75) Inventors: Jae Yong Park, Seoul (KR); Sung Ki Kim, Seoul (KR); Myung Ho Lee, Kyounggi-do (KR); Ock Hee Kim, Kyounggi-do (KR)

(73) Assignee: LG Display Co., Ltd., Seoul (KR)

( * ) Notice: Subject to any disclaimer, the term of this patent is extended or adjusted under 35 U.S.C. 154(b) by 641 days.

(21) Appl. No.: 10/020,986

(22) Filed: Dec. 19, 2001

(65) Prior Publication Data

US 2002/0101156 A1 Aug. 1, 2002

(30) Foreign Application Priority Data

Dec. 23, 2000 (KR) .................. 10-2000-0081416
Dec. 27, 2000 (KR) .................. 10-2000-0083105

(51) Int. Cl.
*H05B 33/04* (2006.01)
*H05B 33/14* (2006.01)

(52) U.S. Cl. .................. 313/512; 313/504; 313/506; 313/46; 445/24

(58) Field of Classification Search ............ 313/512, 313/511, 504, 506; 445/24, 25
See application file for complete search history.

(56) References Cited

U.S. PATENT DOCUMENTS

| | | | | |
|---|---|---|---|---|
| 5,189,405 | A * | 2/1993 | Yamashita et al. | 313/512 |
| 5,811,177 | A * | 9/1998 | Shi et al. | 428/209 |
| 5,821,692 | A * | 10/1998 | Rogers et al. | 313/512 |
| 5,882,761 | A * | 3/1999 | Kawami et al. | 428/69 |
| 5,990,615 | A | 11/1999 | Sakaguchi et al. | |
| 6,172,458 | B1 * | 1/2001 | Nakaya et al. | 313/504 |
| 6,180,176 | B1 * | 1/2001 | Gledhill et al. | 427/387 |
| 6,195,142 | B1 * | 2/2001 | Gyotoku et al. | 349/69 |
| 6,265,820 | B1 * | 7/2001 | Ghosh et al. | 313/483 |
| 6,284,342 | B1 * | 9/2001 | Ebisawa et al. | 428/69 |
| 6,383,048 | B1 * | 5/2002 | Yang et al. | 445/24 |

(Continued)

FOREIGN PATENT DOCUMENTS

EP 1 014 757 6/2000

(Continued)

OTHER PUBLICATIONS

Takashi Nagasawa "Organic EL Manufacturing System,", Special Edition 1-Organic EL/Inorganic EL, Monthly Display, Sep. 2000, Citation 6, pp. 42-47 (w/English translation).

(Continued)

*Primary Examiner*—Sikha Roy
(74) *Attorney, Agent, or Firm*—Morgan Lewis & Bockius LLP

(57) ABSTRACT

An electro-luminescence device includes a transparent substrate; a plurality of pixel areas including a plurality of scanning lines and a plurality of data lines formed on the transparent substrate; a plurality of pixel electrodes formed on the plurality of pixel areas; an electro-luminescent layer formed over the plurality of pixel electrodes; a metal electrode formed on the electro-luminescent layer; a seal cover plate for sealing the electro-luminescent layer; a sealant for adhering the seal cover plate to the transparent substrate; and a heat-exhausting layer formed on the metal electrode.

13 Claims, 3 Drawing Sheets

U.S. PATENT DOCUMENTS

| | | |
|---|---|---|
| 6,520,821 B1 * | 2/2003 | Ishii et al. .................... 445/25 |
| 6,635,989 B1 * | 10/2003 | Nilsson et al. ............. 313/512 |
| 6,696,178 B2 * | 2/2004 | Igarashi ...................... 428/690 |
| 6,734,625 B2 * | 5/2004 | Vong et al. .................. 313/509 |
| 6,765,351 B2 * | 7/2004 | Forrest et al. ............... 313/506 |
| 2002/0057565 A1 * | 5/2002 | Seo ............................. 362/84 |
| 2002/0070663 A1 * | 6/2002 | Ogura et al. ................ 313/506 |
| 2004/0004436 A1 * | 1/2004 | Yoneda ....................... 313/512 |

FOREIGN PATENT DOCUMENTS

| | | |
|---|---|---|
| JP | 05-114486 | 5/1993 |
| JP | 07-153571 | 6/1995 |
| JP | 07-176384 | 7/1995 |
| JP | 07-211455 | 8/1995 |
| JP | 07-288185 | 10/1995 |
| JP | 10-12385 | 1/1998 |
| JP | 2800813 | 9/1998 |
| JP | 10-268360 | 10/1998 |
| JP | 10-275680 | 10/1998 |
| JP | 10-275681 | 10/1998 |
| JP | 11-026662 | 1/1999 |
| JP | 11-111452 | 4/1999 |
| JP | 11-111453 | 4/1999 |
| JP | 11-186551 | 7/1999 |
| JP | 2000-150168 | 5/2000 |
| JP | 2000-195661 | 7/2000 |
| JP | 2000-215982 | 8/2000 |
| JP | 2000-286426 | 10/2000 |
| JP | 2002-117973 | 4/2002 |
| KR | 1998-0071030 | 10/1998 |
| KR | 10-236011 | 6/1999 |
| KR | 1999-081659 | 11/1999 |

OTHER PUBLICATIONS

"*Organic Electroluminescence (EL) Display Production System*" Takashi Nagasawa, Monthly Display Sep. 2000, vol. 6, No. 9, p. 43 (With English-language translation).

* cited by examiner

ELECTRO-LUMINESCENCE DEVICE WITH IMPROVED THERMAL CONDUCTIVITY

This application claims the benefit of Korean Patent Application No. P2000-81416 filed in Korea on Dec. 23, 2000 and Korean Patent Application No. P2000-83105 filed in Korea on Dec. 27, 2000, which are hereby incorporated by reference.

BACKGROUND OF THE INVENTION

1. Field of the Invention

The present invention relates to an electro-luminescence device, and more particularly, to an electro-luminescence device that is adapted to improve thermal conductivity and have a simplified fabrication process.

2. Discussion of the Related Art

Recently, various flat panel display devices reduced in weight and bulk have been developed that are capable of reducing the disadvantages of a cathode ray tube (CRT). Such flat panel display devices include a liquid crystal display (LCD), a field emission display (FED), a plasma display panel (PDP) and an electro-luminescence device (ELD).

In particular, an ELD typically has a structure in which electrodes are attached to each side of an electro-luminescent layer consisting of a hole-transporting layer, an emitting layer and an electron-transporting layer. The ELD has been highlighted as a next generation flat panel display, owing to its characteristics of wide viewing angle, high aperture ratio and high chrominance.

Such ELDs are classified for the most part into inorganic ELDs and organic ELDs, depending on their material. An organic ELD has an advantage in that, because electrons and holes make a pair when electric charges are injected into an organic luminescent layer provided between a hole injection electrode and an electron injection electrode and emit a light upon their extinction, the organic ELD can be driven with a lower voltage than the inorganic ELD. Further, the organic ELD can be not only formed on a transparent substrate having a flexibility like a plastic, but it also can be driven with a low voltage, of less than about 10V, in comparison to the PDP or the inorganic ELD. In addition, the organic ELD has a relatively small power consumption and an excellent color sense.

ELDs can also be classified into passivation ELDs and active matrix ELDs, depending on their driving system.

Hereinafter, a conventional ELD will be described with reference to the accompanying drawings.

Generally, an ELD includes a transparent electrode formed on a transparent substrate, an electroluminescent (EL) layer provided at the upper portion of the transparent electrode, a metal electrode formed on the EL layer, and a seal cover plate joined with the transparent oppositely at the upper portion of the metal electrode.

First, a passivation ELD includes a transparent electrode having a stripe shape and arranged in a line at the transparent substrate, a protective film formed on the entire passivation ELD, including the transparent electrode, an EL layer in which a hole-transporting layer, an emitting layer and an electron-transporting layer are disposed, a cathode electrode taking a stripe shape and crossing the transparent electrode on the EL layer, a seal cover plate attached with a supporting film formed from a semi-transmitting film containing a moisture-absorbing agent, and a sealant for oppositely joining the transparent substrate with the seal cover plate.

The active matrix ELD will be described with reference to FIG. 1 below.

As shown in FIG. 1, the active matrix ELD includes scanning lines and data lines arranged on a transparent substrate 1 in a matrix including pixel areas. Switching devices 2b are provided at intersections of the scanning lines and the data lines. Pixel electrodes 2a are electrically connected to the switching devices 2b and are provided at the pixel areas. A protective film 10 is formed at the entire surface thereof, including the pixel electrodes 2a. An electro-luminescent (EL) layer 3, including a hole-transporting layer 3a, an emitting layer 3b and an electron-transporting layer 3c, is disposed on the protective film 10. A metal electrode 4 is formed on the EL layer 3. A protective film 5 is provided over the metal electrode 4. A seal cover plate 7 contains a moisture-absorbing agent 8 and is attached with a supporting film 9 formed from a semi-transmitting film. A sealant 6 joins the transparent substrate 1 and the seal cover plate 7.

Each switching device 2b consists of a thin film transistor. Herein, each pixel electrode 2a is used as an anode electrode while the metal electrode 4 is used as a cathode electrode. At this time, the seal cover plate 7 and the transparent substrate 1 are joined to each other with sealant 6, which can be, for example, an epoxy resin therebetween at a place sealed with an inactive gas such as, for example, nitrogen or argon in accordance with a general encapsulation method.

The EL layer 3 and the metal electrode 4, which are formed of a metal, react with oxygen in water or in the and are easily oxidized, thereby causing the device to deteriorate. Therefore, moisture is removed by the moisture-absorbing agent 8, and the seal cover plate 7 and the transparent substrate 1 adhere to each other by means of an adhesive 6 under an inactive gas. At this time, nitrogen $N_2$ which is a type of inactive gas, is injected into a space defined by said adhesion of the seal cover plate 7 to the transparent substrate 1.

The seal cover plate 7 may be formed of, for example, of a glass, a plastic or a canister. The moisture-absorbing agent 8 is formed of a fine powder containing, for example, BaO, $CaCO_3$, zeolite, silicagel or alumina. Said fine powder is put in the seal cover plate 7 and is attached with the supporting film 9, which may be, for example, paper or Teflon. Herein, it is important to form the moisture-absorbing agent 8 flatly and evenly.

However, heat is generated upon driving a panel of the ELD. Becuase it is not easy for the conventional seal cover plate 7, using a metal canister or a glass, to exhaust such heat, the characteristics of the device deteriorate. Also, because it is not easy to exhaust heat from the center of the panel if a portion of the panel is enlarged even though a metal canister is used, the characteristics of the device further deteriorate.

Moreover, a thin seal cover plate is used to manufacture a display model of more than 5 inches because the use of metal canisters is limited due to production costs. Since such thin seal cover plates have low thermal conductivity, they fail to exhaust heat generated upon driving the panel of the ELD. Further, the thin seal cover plate becomes a thermal conduction path through nitrogen $N_2$ in a state filled with a nitrogen gas to accumulate said generated heat in the thin plate having a low thermal conductivity and to residue the heat in a state sealed fully by an adhesive. Such heat results in the deterioration of the EL device.

SUMMARY OF THE INVENTION

Accordingly, the present invention is directed to an electro-luminescence device that substantially obviates one or more of the problems due to the limitations and disadvantages of the related art.

An object of the present invention is to provide an electro-luminescence device that is adapted to improve thermal conductivity and have a simplified fabrication process.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the electro-luminescence device according to one aspect of the present invention includes a transparent substrate; a plurality of pixel areas including a plurality of scanning lines and a plurality of data lines formed on the transparent substrate; a plurality of pixel electrodes formed on the plurality of pixel areas; an electro-luminescent layer formed over the plurality of pixel electrodes; a metal electrode formed on the electro-luminescent layer; a seal cover plate for sealing the electro-luminescent layer; a sealant for adhering the seal cover plate to the transparent substrate; and a heat-exhausting layer formed on the metal electrode.

In another aspect of the present invention, the electro-luminescence device includes a transparent substate; a plurality of pixel areas including a plurality of scanning lines and a plurality of data lines formed on the transparent substrate; a plurality of pixel electrodes formed on the plurality of pixel areas; an electro-luminescent layer over the plurality of pixel electrodes; a metal electrode formed on the electro-luminescent layer; a seal cover plate for sealing the electro-luminescent layer; a sealant for adhering the seal cover plate to the transparent substrate; and a heat-exhausting layer formed on the seal cover plate.

In yet another aspect of the present invention, the electro-luminescence device includes a transparent substate; a plurality of pixel areas including a plurality of scanning lines and a plurality of data lines formed on the transparent substrate; a plurality of pixel electrodes formed on the plurality of pixel areas; an electro-luminescent layer over the plurality of pixel electrodes; a metal electrode formed on the electro-luminescent layer; a protective film formed on the metal electrode to prevent exposure of the metal electrode; and a heat-exhausting layer provided on the protective film.

In yet another aspect of the present invention, the electro-luminescence device includes a transparent substate; a plurality of pixel areas including a plurality of scanning lines and a plurality of data lines formed on the transparent substrate; a plurality of pixel electrodes formed on the plurality of pixel areas; an electro-luminescent layer over the plurality of pixel electrodes; a metal electrode formed on the electro-luminescent layer; a seal cover plate formed in a plane to seal the electro-luminescent layer; a metal thin film provided on the seal cover plate to smoothly transfer heat; and a sealant for adhering the seal cover plate and the metal thin film to the transparent substrate, said sealant having a space for injecting an inactive gas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
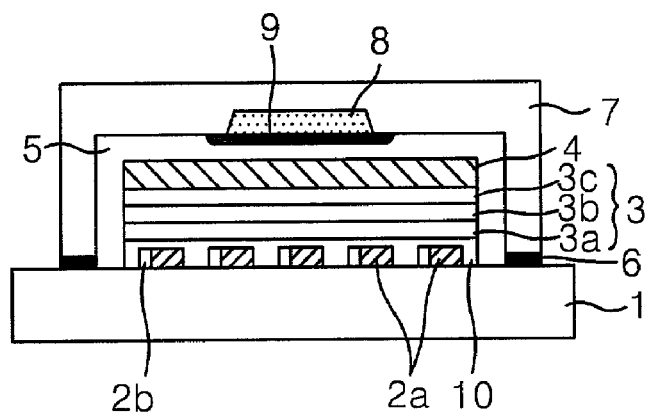
FIG. 1 is a section view showing a structure of a conventional electro-luminescence device.
Figure 2:
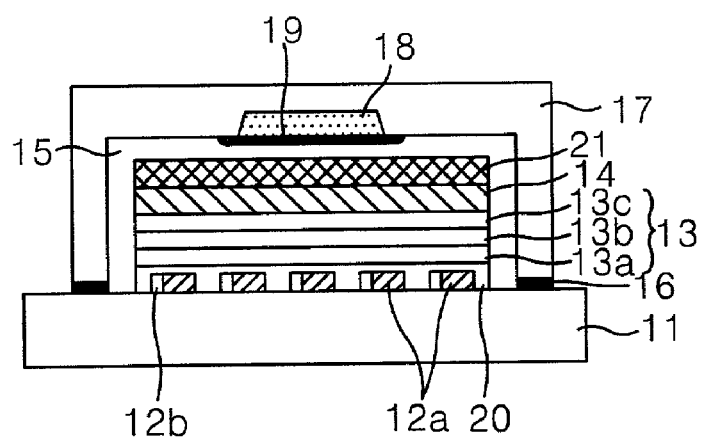
FIG. 2 is a section view showing a structure of an electro-luminescence device according to a first embodiment of the present invention.

Referring to FIG. 2, there is shown an active matrix electro-luminescence device (ELD) according to a first embodiment of the present invention.

The ELD includes scanning lines and data lines arranged on a transparent substrate 11 in a matrix that includes pixel areas. Switching devices 12b are provided at intersections of the scanning lines and the data lines. Pixel electrodes 12a are electrically connected to the switching devices 12b and provided at the pixel areas. A protective film 20 is formed at the entire surface thereof, including the pixel electrodes 12a. An electro-luminescent (EL) layer 13, including a hole-transporting layer 13a, an emitting layer 13b and an electron-transporting layer 13c, is disposed on the protective film 20. A metal electrode 14 is formed on the EL layer 13. A seal cover plate 17 contains a moisture-absorbing agent 18 and is attached with a supporting film 19 formed from a semi-transmitting film. A sealant 16 is used to join the transparent substrate 11 and the seal cover plate 17.

The switching devices 12b consist of thin film transistors. Herein, the pixel electrodes 12a are used as anode electrodes while the metal electrode 14 is used as a cathode electrode.

The ELD further includes a heat-exhausting layer 21 for preventing an exposure of the metal electrode 14, and a protective film 15 provided over the metal electrode 14 to prevent exposure of the metal electrode 14.

Moisture is removed by the moisture-absorbing agent 18. The seal cover plate 17 and the transparent substrate 11 adhere to each other under an inactive gas atmosphere to thereby fill an inactive gas between the seal cover plate 17 and the transparent substrate 11.

The protective film 15 has a single-layer structure of a moisture-absorbing layer or a moisture-proof layer, or a multi-layer structure built with said two layers.

The heat-exhausting layer 21 may be formed by depositing, coating or taping a carbon group material or other material having a good thermal conductivity. Said carbon group material may include, for example, DLC, a-C:H, Graphite, a carbon film or a carbon sheet.

The seal cover plate 17 may be, for example, formed from a glass, a plastic or a canister. The moisture-absorbing agent 18 may be made from a fine powder containing, for example, BaO, $CaCO_3$, zeolite, silicagel or alumina. The fine powder is put in the seal cover plate 17 and is attached with the supporting film 19, which may be formed of, for example, paper or Teflon. Herein, it is essential to form the moisture-absorbing agent 18 flatly and evenly.

Hereinafter, a method of fabricating the above-mentioned ELD will be described.

First, the pixel electrodes 12a may be formed from an indium thin oxide (ITO) transparent electrode on the transparent substrate 11. Next, the EL layer 13 is formed by disposing the hole-transporting layer 13a, the emitting layer 13b and the electron-transporting layer 13c sequentially. The metal electrode 14, the protective film 15 formed from at least one of a moisture-absorbing layer and a moisture-proof layer on the metal electrode 14 and the heat-exhausting layer 21 are provided in turn. Consequently, the seal cover plate 17, in which the moisture-absorbing agent 18 is supported by the supporting film 19, is attached to the transparent substrate 11 by means of the sealant 16, which may be, for example, an epoxy resin.

Figure 3:
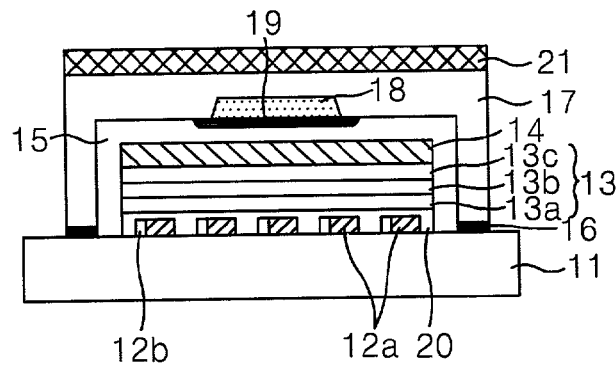
FIG. 3 is a section view showing a structure of an electro-luminescence device according to a second embodiment of the present invention.

FIG. 3 is a section view showing a structure of an active matrix ELD according to a second embodiment of the present invention.

Referring to FIG. 3, the ELD according to the second embodiment has elements identical to the ELD in FIG. 2 except that the heat-exhausting layer 21 is provided on the upper portion of the seal cover plate 17 rather than the upper portion of the metal electrode 14.

In the ELD, the heat-exhausting layer 21 may be further provided to prevent exposure of the metal electrode 14, and a protective film 15 may be further provided over the metal electrode 14. The protective film 15 may be included to prevent exposure of the metal electrode 14.

The protective film 15 has a single-layer structure of a moisture-absorbing layer or a moisture-proof layer, or a multi-layer structure built with said two layers.

The heat-exhausting layer 21 may be formed by depositing, coating or taping a carbon group material or other material having a good thermal conductivity. Said carbon group material may include, for example, DLC, a-C:H, Graphite, a carbon film or a carbon sheet.

The seal cover plate 17 may be, for example, formed from a glass, a plastic or a canister. The moisture-absorbing agent 18 may be made from a fine powder containing, for example, BaO, $CaCO_3$, zeolite, silicagel or alumina. The fine powder is put in the seal cover plate 7 and is attached with the supporting film 19, which may be formed of, for example, paper or Teflon. Accordingly, the moisture-absorbing agent 18 is formed flatly and evenly.

Moisture is removed by the moisture-absorbing agent 18. The seal cover plate 17 and the transparent substrate 11 adhere to each other under an inactive gas atmosphere to thereby fill an inactive gas between the seal cover plate 17 and the transparent substrate 11.

Hereinafter, a method of fabricating the above-mentioned ELD will be described.

First, the pixel electrodes 12a may be formed from an ITO transparent electrode on the transparent substrate 11. Next, the EL layer 13 is formed by disposing the hole-transporting layer 13a, the emitting layer 13b and the electron-transporting layer 13c, sequentially. The metal electrode 14, the protective film 15 formed from at least one of a moisture-absorbing layer and a moisture-proof layer on the metal electrode 14 and the heat-exhausting layer 21 are provided in turn. Subsequently, the seal cover plate 17, in which the moisture-absorbing agent 18 is supported by the supporting film 19, is attached to the transparent substrate 11 by means of the sealant 16, which may be, for example, an epoxy resin. Finally, the heat-exhausting layer 21 is formed on the seal cover plate 17.

Figure 4:
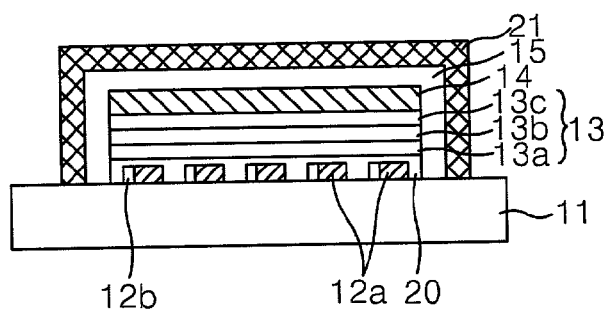
FIG. 4 is a section view showing a structure of an electro-luminescence device according to a third embodiment of the present invention.

FIG. 4 is a section view showing a structure of an active matrix ELD according to a third embodiment of the present invention.

Referring to FIG. 4, the ELD includes scanning lines and data lines arranged on a transparent substrate 11 in a matrix including pixel areas. Switching devices 12b are provided at intersections of the scanning lines and the data lines. Pixel electrodes 12a are electrically connected to the switching devices 12b and provided at the pixel areas and formed from transparent electrodes. A protective film 20 is formed at the entire surface thereof, including the pixel electrodes 12a. An electro-luminescent (EL) layer 13, including a hole-transporting layer 13a, an emitting layer 13b and an electron-transporting layer 13c, is disposed on the protective film 20. A metal electrode 14 is formed on the EL layer 13. A protective film 15 is provided at the upper portion of the metal electrode 14 to prevent exposure of the metal electrode 14. A heat-exhausting layer 21 is provided for preventing exposure of the protective film 15.

Herein, the heat-exhausting layer 21 may be provided only on the upper portion of the protective film 15.

The protective film 15 may have a single-layer structure of a moisture-absorbing layer or a moisture-proof layer, or a multi-layer structure built with said two layers.

The heat-exhausting layer 21 may be formed by depositing, coating or taping a carbon group material or other material having a good thermal conductivity. Said carbon group material may include, for example, DLC, a-C:H, Graphite, a carbon film or a carbon sheet.

Hereinafter, a method of fabricating the above-mentioned ELD will be described.

First, the pixel electrodes 12a may be formed from an ITO transparent electrode on the transparent substrate 11. Next, the EL layer 13 is formed by disposing the hole-transporting layer 13a, the emitting layer 13b and the electron-transporting layer 13c, sequentially. Consequently, the metal electrode 14, the protective film 15 formed from at least one of a moisture-absorbing layer and a moisture-proof layer on the metal electrode 14 and the heat-exhausting layer 21 are provided in turn.

Figure 5:
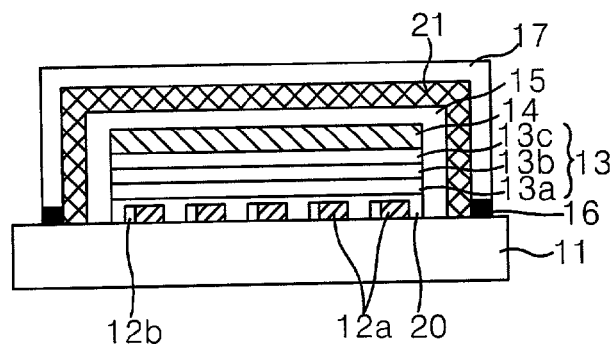
FIG. 5 is a section view showing a structure of an electro-luminescence device according to a fourth embodiment of the present invention.

FIG. 5 is a section view showing a structure of an active matrix ELD according to a fourth embodiment of the present invention.

Referring to FIG. 5, the ELD includes scanning lines and data lines arranged on a transparent substrate 11 in a matrix including pixel areas. Switching devices 12b are provided at intersections of the scanning lines and the data lines. Pixel electrodes 12a are electrically connected to the switching devices 12b and provided at the pixel areas and formed from transparent electrodes. A protective film 20 is formed at the entire surface thereof, including the pixel electrodes 12a. An electro-luminescent (EL) layer 13, including a hole-transporting layer 13a, an emitting layer 13b and an electron-transporting layer 13c, is disposed on the protective film 20. A metal electrode 14 is formed on the EL layer 13. A protective film 15 is provided at the upper portion of the metal electrode 14 to prevent exposure of the metal electrode 14. A heat-exhausting layer 21 may be provided to prevent exposure of the protective film 15. A seal cover plate is provided at the upper portion of the heat-exhausting layer 21 to seal the EL layer 13. A sealant 16 is provided for adhering the seal cover plate 17 to the transparent substrate 11 at the periphery of an emitting area in which the pixel electrodes 12a cross the metal electrode 14 to form pixels.

Herein, the heat-exhausting layer 21 may be provided on the upper portion of the protective film 15.

The protective film 15 may have a single-layer structure of a moisture-absorbing layer or a moisture-proof layer, or a multi-layer structure built with said two layers.

The heat-exhausting layer 21 may be formed by depositing, coating or taping a carbon group material or other material having a good thermal conductivity. Said carbon group material may include, for example, DLC, a-C:H, Graphite, a carbon film or a carbon sheet.

Hereinafter, a method of fabricating the above-mentioned ELD will be described.

First, the pixel electrodes 12a may be formed from an ITO transparent electrode on the transparent substrate 11. Next, the EL layer 13 is formed by disposing the hole-transporting layer 13a, the emitting layer 13b and the electron-transporting layer 13c, sequentially. The metal electrode 14, the protective film 15 formed from at least one of a moisture-absorbing layer and a moisture-proof layer on the metal electrode 14 and the heat-exhausting layer 21 are provided in turn. Consequently, the seal cover plate 17 is attached to the transparent substrate 11 by means of the sealant 16, which may be, for example, an epoxy resin.

Figure 6:
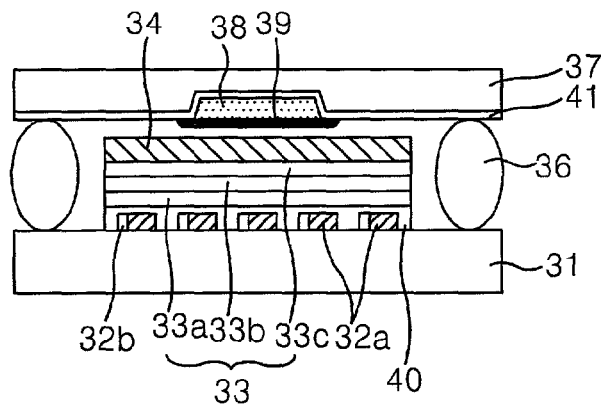
FIG. 6 is a section view showing a structure of an electro-luminescence device according to a fifth embodiment of the present invention.

FIG. 6 is a section view showing a structure of an active matrix ELD according to a fifth embodiment of the present invention.

Referring to FIG. 6, the ELD includes scanning lines and data lines arranged on a transparent substrate 31 in a matrix including pixel areas. Switching devices 32b are provided at intersections of the scanning lines and the data lines. Pixel electrodes 32a are electrically connected to the switching devices 32b and provided at the pixel areas and formed from transparent electrodes. A protective film 40 is formed at the entire surface thereof, including the pixel electrodes 32a. An electro-luminescent (EL) layer 33, including a hole-transporting layer 33a, an emitting layer 33b and an electron-transporting layer 33c, is disposed on the protective film 40. A metal electrode 34 is formed on the EL layer 33. A seal cover plate 37 is formed in a plane shape to seal the EL layer 33. A sealant 36 is provided for adhering the seal cover plate 37 to the transparent substrate 31 at the periphery of an emitting area in which the pixel electrodes 32a cross the metal electrode 34 to form pixels.

Herein, the seal cover plate 37 and the transparent substrate 31 are joined with the sealant 36, which may be, for example, an epoxy resin, in accordance with the encapsulation method.

The ELD further includes a metal thin film 41 made from a metal having a better hydrophile than the seal cover plate 37, an excellent adhesiveness and a high thermal conductivity. This metal thin film 41 adheres to the entire surface of the seal cover plate 37.

The seal cover plate 37 may be formed, for example, from a glass, a plastic or a canister. The moisture-absorbing agent 38 may be made from a fine powder containing, for example, BaO, CaCO$_3$, zeolite, silicagel or alumina. This fine powder is put in the seal cover plate 37 and is attached with the supporting film 39, which may be formed of, for example, paper or Teflon. Accordingly, the moisture-absorbing agent 38 is formed flatly and evenly.

Moisture is removed by the moisture-absorbing agent 38. The seal cover plate 37 and the transparent substrate 31 adhere to each other under an inactive gas atmosphere to prevent deterioration caused by moisture and oxygen.

Figure 7:
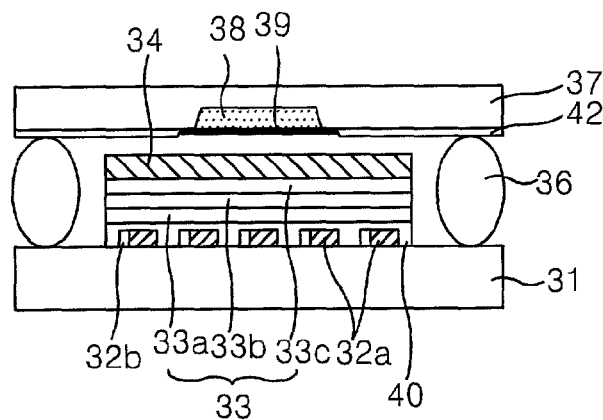
FIG. 7 is a section view showing a structure of an electro-luminescence device according to a sixth embodiment of the present invention.

FIG. 7 is a section view showing a structure of an active matrix ELD according to a sixth embodiment of the present invention.

Referring to FIG. 7, the ELD includes scanning lines and data lines arranged on a transparent substrate 31 in a matrix including pixel areas. Switching devices 32b are provided at intersections of the scanning lines and the data lines. Pixel electrodes 32a are electrically connected to the switching devices 32b and provided at the pixel areas and formed from transparent electrodes. A protective film 40 is formed at the entire surface thereof, including the pixel electrodes 32a. An electro-luminescent (EL) layer 33, including a hole-transporting layer 33a, an emitting layer 33b and an electron-transporting layer 33c is disposed on the protective film 40. A metal electrode 34 is formed on the EL layer 33. A seal cover plate 37 is formed in a plane shape to seal the EL layer 33. A sealant 36 is provided for adhering the seal cover plate 37 to the transparent substrate 31 at the periphery of an emitting area in which the pixel electrodes 32a cross the metal electrode 34 to form pixels.

The ELD further includes a metal thin film 42 made from a metal having a better hydrophile than the seal cover plate 37, an excellent adhesiveness and a high thermal conductivity.

Herein, the seal cover plate 37 and the transparent substrate 31 are joined with the sealant 36, which may be, for example, an epoxy resin, in accordance with the encapsulation method.

The seal cover plate 37 may be formed, for example, from a glass, a plastic or a canister. The moisture-absorbing agent 38 may be made from a fine powder containing, for example, BaO, CaCO$_3$, zeolite, silicagel or alumina. The fine powder is put in the seal cover plate 37 and is attached with the supporting film 39, which may be formed of, for example, paper or Teflon. Accordingly, the moisture-absorbing agent 38 is formed flatly and evenly.

Moisture is removed by the moisture-absorbing agent 38. The seal cover plate 37 and the transparent substrate 31 adhere to each other under an inactive gas atmosphere to prevent a deterioration caused by a moisture and an oxygen.

In particular, the metal thin film 42 is formed on an area of the seal cover plate 37 at which the moisture-absorbing agent 38 is not attached to the supporting film 39.

Figure 8:
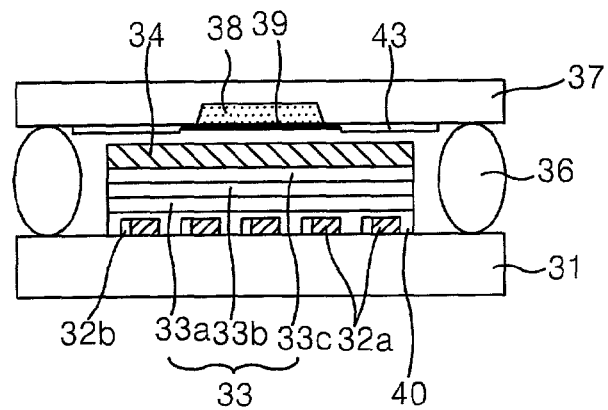
FIG. 8 is a section view showing a structure of an electro-luminescence device according to a seventh embodiment of the present invention.

FIG. 8 is a section view showing a structure of an active matrix ELD according to a seventh embodiment of the present invention.

Referring to FIG. 8, the ELD includes scanning lines and data lines arranged on a transparent substrate 31 in a matrix including pixel areas. Switching devices 32b are provided at intersections of the scanning lines and the data lines. Pixel electrodes 32a are electrically connected to the switching devices 32b and provided at the pixel areas and formed from transparent electrodes. A protective film 40 is formed at the entire surface thereof, including the pixel electrodes 32a. An electro-luminescent (EL) layer 33 including a hole-transporting layer 33a, an emitting layer 33b and an electron-transporting layer 33c, is disposed on the protective film 40. A metal electrode 34 is formed on the EL layer 33. A seal cover plate 37 is formed in a plane shape to seal the EL layer 33. A sealant 36 is provided for adhering the seal cover plate 37 to the transparent substrate 31 at the periphery of an emitting area in which the pixel electrodes 32a cross the metal electrode 34 to form pixels.

The ELD further includes a metal thin film 43 made from a metal having a better hydrophile than the seal cover plate 37, an excellent adhesiveness and a high thermal conductivity.

Herein, the seal cover plate 37 and the transparent substrate 31 are joined with the sealant 36, which may be, for example, an epoxy resin, in accordance with the encapsulation method.

The seal cover plate 37 may be formed, for example, from a glass, a plastic or a canister. The moisture-absorbing agent 38 may be made from a fine powder containing, for example, BaO, CaCO$_3$, zeolite, silicagel or alumina. The fine powder is put in the seal cover plate 37 and is attached with the supporting film 39, which may be formed of, for example, paper or Teflon. Accordingly, the moisture-absorbing agent 38 is formed flatly and evenly.

Moisture is removed by the moisture-absorbing agent 38. The seal cover plate 37 and the transparent substrate 31 adhere to each other under an inactive gas atmosphere to prevent a deterioration caused by moisture and oxygen.

In particular, the metal thin film 43 is formed on an area of the seal cover plate 37 at which the moisture-absorbing agent 38 is not attached to the supporting film 39, and on an area of the seal cover plate 37 other than an area at which the seal cover plate 37 and the transparent substrate 31 are joined to each other by means of the sealant 36.

Accordingly, the ELDs according to the first to fourth embodiments provide a heat-exhausting layer 21, which may be made from a carbon group material or other material having a good thermal conductivity at the inner side or the outer side of the seal cover plate 17 for encapsulating the ELD to easily exhaust heat generated upon the driving of the panel of the ELD, thereby preventing an excessive deterioration of the device to improve a response thereof.

Also, the ELD's according to the fifth to seventh embodiments of the present invention are formed from a material that induces a distribution effect of heat generated upon the driving of the EL device to have high stability and response, so that it becomes possible to manufacture an EL device that can improve thermal conductivity and simplify its fabrication process.

As described above, according to the present invention, the metal thin film having a good thermal conductivity and a low surface energy is provided on the planar seal cover plate, so that it becomes possible to manufacture a device having a light weight and a small thickness that compensates for thermal stability. Also, heat generating from the EL device can be effectively distributed to improve stability and response.

Furthermore, according to the present invention, the heat-exhausting layer is formed from a carbon group material or other material having good thermal conductivity at the inner side or the outer side of the seal cover plate to easily exhaust heat generated upon driving of the panel of the ELD, thereby preventing an excessive deterioration of the device to improve a response thereof.

It will be apparent to those skilled in the art that various modifications and variations can be made in the electro-lumiscence device of the present invention without departing from the spirit or scope of the invention. Thus, it is intended that the present invention cover the modifications and variations of this invention provided they come within the scope of the appended claims and their equivalents.

What is claimed is:

1. An electro-luminescence device, comprising:
   a transparent substrate;
   a plurality of pixel areas including a plurality of scanning lines and a plurality of data lines formed on the transparent substrate;
   a plurality of pixel electrodes formed on the plurality of pixel areas;
   an electro-luminescent layer over the plurality of pixel electrodes;
   a metal electrode formed on the electro-luminescent layer;
   a flat seal cover plate formed in a plane to seal the electro-luminescent layer;
   a heat-exhausting layer formed of a metal thin film, directly formed on the inner side of the seal cover plate and exposed to a space between the metal electrode and the seal cover plate;
   a moisture-absorbing agent provided at the inner side of a portion of the heat-exhausting layer opposed to the metal electrode to absorb moisture and oxygen from the electro-luminescent layer; and
   a sealant having a thickness larger than that of the electro-luminescent layer and the metal electrode for adhering an edge of the flat seal cover plate and the heat-exhausting layer to the transparent substrate, said sealant having space for injecting an inactive gas, wherein an entire surface of the heat-exhausting layer contacts the flat seal cover plate.

2. The electro-luminescence device according to claim 1, further comprising:
   a semi-transmissive film for supporting the moisture-absorbing agent to be held at the inner side of the heat-exhausting layer.

3. The electro-luminescence device according to claim 2, wherein the moisture-absorbing agent is selected from any one of BaO, CaO, CaCO$_3$, zeolite, silicagel and alumina.

4. The electro-luminescence device according to claim 1, wherein the heat-exhausting layer is formed from a carbon group material.

5. The electro-luminescence device according to claim 4, wherein the carbon group material is selected from any one of DLC, a-C:H, graphite, a carbon film and a carbon sheet.

6. An electro-luminescence device, comprising:
   a transparent substrate;
   a plurality of pixel areas including a plurality of scanning lines and a plurality of data lines formed on the transparent substrate;
   a plurality of pixel electrodes formed on the plurality of pixel areas;
   an electro-luminescent layer over the plurality of pixel electrodes;
   a metal electrode formed on the electro-luminescent layer;
   a flat seal cover plate formed in a plane to seal the electro-luminescent layer;
   a heat-exhausting layer formed of a metal thin film, directly formed on the inner side of the seal cover plate and exposed to a space between the metal electrode and the seal cover plate, the heat-exhausting layer exposing a portion of the seal cover plate to provide a moisture-absorbing agent at the inner side of the seal cover plate;
   a sealant having a thickness larger than that of the electro-luminescent layer and the metal electrode for adhering an edge of the flat seal cover plate and the heat-exhausting layer to the transparent substrate, said sealant having space for injecting an inactive gas, wherein an entire surface of the heat-exhausting layer contacts the flat seal cover plate,
   the moisture-absorbing agent provided at the exposed portion of the flat seal cover plate opposed to the metal electrode to absorb moisture and oxygen from the electro-luminescent layer; and
   a semi-transmissive film for supporting the moisture-absorbing agent to be held at the inner side of the flat seal cover plate,
   wherein the heat-exhausting layer adheres to a portion of the flat seal cover plate on which the moisture-absorbing agent is not formed.

7. The electro-luminescence device according to claim 6, wherein the moisture-absorbing agent is selected from any one of BaO, CaO, $CaCO_3$, zeolite, silicagel and alumina.

8. The electro-luminescence device according to claim 6, wherein the heat-exhausting layer is formed from a carbon group material.

9. The electro-luminescence device according to claim 8, wherein the carbon group material is selected from any one of DLC, a-C:H, graphite, a carbon film and a carbon sheet.

10. An electro-luminescence device, comprising:
   a transparent substrate;
   a plurality of pixel areas including a plurality of scanning lines and a plurality of data lines formed on the transparent substrate;
   a plurality of pixel electrodes formed on the plurality of pixel areas;
   an electro-luminescent layer over the plurality of pixel electrodes;
   a metal electrode formed on the electro-luminescent layer;
   a flat seal cover plate formed in a plane to seal the electro-luminescent layer;
   a heat-exhausting layer formed of a metal thin film, directly formed on the inner side of the seal cover plate and exposed to a space between the metal electrode and the seal cover plate, the heat-exhausting layer exposing a portion of the seal cover plate to provide a moisture-absorbing agent at the inner side of the seal cover plate;
   a sealant having a thickness larger than that of the electro-luminescent layer and the metal electrode for adhering an edge of the flat seal cover plate to the transparent substrate, said sealant having space for injecting an inactive gas, wherein an entire surface of the heat-exhausting layer contacts the flat seal cover plate,
   the moisture-absorbing agent provided at the exposed portion of the flat seal cover plate opposed to the metal electrode to absorb moisture and oxygen from the electro-luminescent layer; and
   a semi-transmissive film for supporting the moisture-absorbing agent to be held at the inner side of the flat seal cover plate,
   wherein the heat-exhausting layer adheres to a portion of the flat seal cover plate on which the moisture-absorbing agent is not formed and the sealant is not attached.

11. The electro-luminescence device according to claim 10, wherein the moisture-absorbing agent is selected from any one of BaO, CaO, $CaCO_3$, zeolite, silicagel and alumina.

12. The electro-luminescence device according to claim 10, wherein the heat-exhausting layer is formed from a carbon group material.

13. The electro-luminescence device according to claim 12, wherein the carbon group material is selected from any one of DLC, a-C:H, graphite, a carbon film and a carbon sheet.

* * * * *